United States Patent
Kossel et al.

(10) Patent No.: US 11,057,039 B1
(45) Date of Patent: Jul. 6, 2021

(54) CLOCK DIVIDER WITH QUADRATURE ERROR CORRECTION

(71) Applicant: INTERNATIONAL BUSINESS MACHINES CORPORATION, Armonk, NY (US)

(72) Inventors: Marcel A. Kossel, Reichenburg (CH); Vishal Khatri, Gonda (IN); Pier Andrea Francese, Adliswil (CH); Matthias Braendli, Otelfingen (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/949,325

(22) Filed: Oct. 26, 2020

(51) Int. Cl.
| | |
|---|---|
| H03K 21/40 | (2006.01) |
| H03K 21/02 | (2006.01) |
| H03K 21/10 | (2006.01) |
| H04B 1/40 | (2015.01) |
| H03K 23/44 | (2006.01) |
| H03K 3/037 | (2006.01) |
| H03K 5/156 | (2006.01) |
| H04L 27/36 | (2006.01) |

(52) U.S. Cl.
CPC .......... H03K 21/40 (2013.01); H03K 3/0372 (2013.01); H03K 5/1565 (2013.01); H03K 21/023 (2013.01); H03K 21/026 (2013.01); H03K 21/10 (2013.01); H03K 23/44 (2013.01); H04B 1/40 (2013.01); H04L 27/364 (2013.01)

(58) Field of Classification Search
CPC .................................................... H03K 21/40
See application file for complete search history.

(56) References Cited

U.S. PATENT DOCUMENTS

| | | | | |
|---|---|---|---|---|
| 7,750,708 | B2* | 7/2010 | Gschier | H03B 27/00 327/238 |
| 8,829,954 | B2* | 9/2014 | Taghivand | H03K 3/356182 327/118 |
| 9,479,142 | B1* | 10/2016 | Myers | H03D 3/009 |
| 2016/0094256 | A1 | 3/2016 | Papotto | |
| 2019/0165790 | A1 | 5/2019 | Choi | |
| 2019/0182024 | A1 | 6/2019 | Tajalli | |

OTHER PUBLICATIONS

Chae, et al., "A Quadrature Clock Corrector for DRAM Interfaces, With a Duty-Cycle and Quadrature Phase Detector Based on a Relaxation Oscillator," IEEE, Apr. 2019, pp. 978-982, vol. 27, No. 4, Retrieved from the Internet: <URL: https://ieeexplore.ieee.org/stamp/stamp.jsp?tp=&arnumber=8610228>.

(Continued)

*Primary Examiner* — Hai L Nguyen
(74) *Attorney, Agent, or Firm* — Samuel A. Waldbaum

(57) ABSTRACT

The present disclosure relates to a method for quadrature error correction using a frequency divider circuit. The method comprises delaying input of data to master input terminals and/or slave input terminals of the frequency divider circuit for correcting a quadrature error between the in-phase and quadrature-phase output signals.

11 Claims, 9 Drawing Sheets quadrature error correction (QEC)

(56) References Cited

OTHER PUBLICATIONS

Herzel, et al., "A 60 GHz Frequency Divider with Quadrature Outputs in 130nm SiGe BiCMOS Technology for Optical OFDM Systems," Proceedings of the 10th European Microwave Integrated Circuits (EuMIC), Sep. 7-8, 2015, Retrieved from the Internet: <URL: https://www.researchgate.net/publication/281741238_A_60_GHz_frequency_divider_with_quadrature_outputs_in_130nm_SiGe_BiCMOS_technolog y_for_optical_OFDM_systems>.

Menolfi, et aL,"A 112Gb/s 2.6pJ/b 8-Tap FFE PAM-4 SST TX in 14nm CMOS", 2018 IEEE International Solid-State Circuits Conference—(ISSCC), Feb. 11-15, 2018, pp. 103-105, Retrieved from the Internet: <URL: https://ieeexplore.ieee.org/stamp/stamp.jsp?tp=&arnumber=8310205>.

Raja, et al., "A 0.1-2-GHz quadrature correction loop for digital multiphase clock generation circuits in 130-nm CMOS," IEEE Transactions on Very Large Scale Integration (VLSI) Systems, Oct. 28, 2016, pp. 1044-1053, vol. 25, No. 3, Retrieved from the Internet: <URL: https://ieeexplore.ieee.org/stamp/stamp.jsp?tp=&arnumber=7725561>.

\* cited by examiner

CLOCK DIVIDER WITH QUADRATURE ERROR CORRECTION

BACKGROUND

The present invention relates to the field of digital computer systems, and more specifically, to a frequency divider circuit.

IQ imbalance is a performance-limiting issue in the design of transceivers. IQ imbalances occur due to mismatches between the parallel sections of a transceiver chain dealing with the in-phase (I) and quadrature (Q) signal paths. The IQ imbalance may be modeled by a quadrature error parameter. An optimal quadrature error correction (QEC) may be important to improve signal integrity for high-speed transmitters and receivers.

BRIEF SUMMARY

Additional aspects and/or advantages will be set forth in part in the description which follows and, in part, will be apparent from the description, or may be learned by practice of the invention.

Various embodiments provide a frequency divider circuit and a method as described by the subject matter of the independent claims. Advantageous embodiments are described in the dependent claims. Embodiments of the present invention can be freely combined with each other if they are not mutually exclusive.

In one aspect, the invention relates to a frequency divider circuit comprising: a master and slave latch connected in series and having a feedback path, the master latch including a master reading branch with first input terminals and a master latching branch with quadrature output signals, the slave latch including a slave reading branch with second input terminals and a slave latching branch with in-phase output signals; a first current supplying circuit for supplying a first current to the master reading branch and the master latching branch; a second current supplying circuit for supplying a second current to the slave latching branch and the slave reading branch; a current steering circuit for connecting the first current supplying circuit to the master reading branch and connecting the second current supplying circuit to the slave latching branch in response to a first clock signal; and connecting the second current supplying circuit to the slave reading branch and connecting the first current supplying circuit to the master latching branch in response to a second clock signal; wherein the frequency divider circuit is configured for delaying input of data to the first and/or second input terminals for correcting a quadrature error between the quadrature and in-phase output signals.

In another aspect, the invention relates to a method for quadrature error correction using a frequency divider circuit, the frequency divider circuit comprising a master and slave latch connected in series and having a feedback path, the master latch including a master reading branch with first input terminals and a master latching branch with quadrature output signals, the slave latch including a slave reading branch with second input terminals and a slave latching branch with in-phase output signals; a first current supplying circuit for supplying a first current to the master reading branch and the master latching branch; a second current supplying circuit for supplying a second current to the slave latching branch and the slave reading branch; a current steering circuit for connecting the first current supplying circuit to the master reading branch and connecting the second current supplying circuit to the slave latching branch in response to a first clock signal; and connecting the second current supplying circuit to the slave reading branch and connecting the first current supplying circuit to the master latching branch in response to a second clock signal. The method comprises: delaying input of data to the first and/or second input terminals for correcting a quadrature error between the quadrature and in-phase output signals.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
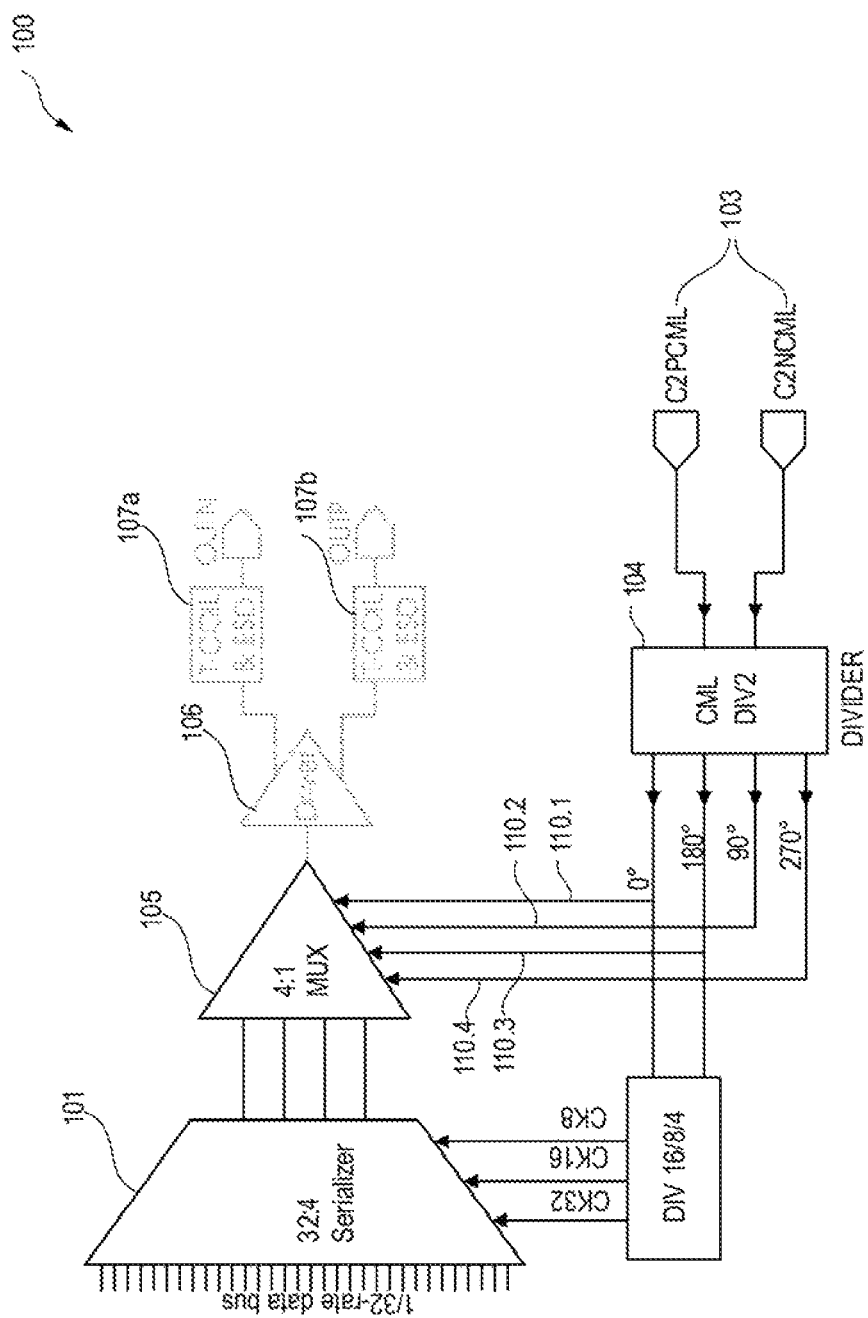
FIG. 1 is a circuit diagram illustrating an exemplary transceiver circuit.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

The present subject matter may enable a quadrature error correction (QEC) while efficiently using the power and area of the frequency divider circuitry. For example, the present subject matter may not require additional circuitry for performing the correction. The present subject matter may directly incorporate the phase correction into the divider by splitting up the control into the master and slave parts of the divider. This may, for example, be performed via splitting up a load control of the divider into a master and slave section. This may allow an individual turnability, resulting in the desired phase correction. This may also have the advantage of improving the signal integrity and jitter of high-speed transmitters and receivers.

The frequency divider circuit (also referred to as clock divider) may be a divide-by-two circuit that is configured to output four phase-offset waveforms. The frequency divider circuit may, for example, divide a frequency F by two and outputs four phase-offset versions of F/2, —offset by 0°, 90°, 180° and 270° referred to as output p0, p90, p180 and p270 respectively. A quadrature error may be the deviation from the 90° phase difference between I and Q terminals. For example, the quadrature error may occur if the difference between output pair p0 and p90 is different from 90° or the difference between output pair p180 and p270 is different from 90°. The quadrature error correction may be performed so that said deviation is mitigated or removed. The quadrature error correction may be performed by introducing variable delays either at the input of the master and slave latches. This delay may be performed either in a clock or data path of the divider. The delay may be implemented via variable CML loads which are individually tunable between master and slave latches. For example, an additional delay at the master latch decreases the phase towards <90° and an additional delay at the slave latch increases the phase towards >90°.

According to one embodiment, the frequency divider circuit is configured for delaying the input of data by delaying first input data signals of the first input terminals and/or second input data signals of the second input terminals.

According to one embodiment, each of the quadrature output signals is connected via a load element to a supply potential and each of the in-phase output signals is connected via a load element to a supply potential. Each load element of the load elements comprises resistors. The frequency divider circuit is configured for delaying the first input data signal and/or the second input data signal by adjusting a resistance of the respective load elements.

This may enable to implement a quadrature error correction within a ½-frequency divider via individual load control of master and slave latches, e.g. by selecting different load resistors between master and slave CML delay stages. This may enable to introduce individually adjustable delays either between master and slave clock inputs of the divider or in front of master and slave data inputs of frequency divider latches.

The frequency divider circuit is configured for adjusting the resistance of the load element by connecting a combination of resistors of the load element. The frequency divider circuit is configured for connecting the combination of resistors using a n-bits delay-setting input level, where n is an initial number of resistors in the load element. The frequency divider circuit further comprises a quadrature error detector configured to receive the in-phase and quadrature output signals, detect the quadrature error and provide control signals comprising the n-bits delay-setting input level.

This may enable to measure the quadrature error at the far-end circuitry (e.g., the detector may be at serializer multiplexers of a transmitter TX or at sampling latches of a receiver RX) and adjust the quadrature phase directly in the clock divider via a proposed variable delay technique so that the targeted 90° phase separation is obtained at the far-end circuitry.

The frequency divider circuit is configured for delaying the input of data by delaying the first clock signal and/or the second clock signal.

Each of the first and second clock signals is connected via an adjustable load element to a supply potential. Each load element of the load elements comprises resistors. The frequency divider circuit is configured for delaying the first clock signal and/or the second clock signal by adjusting the resistance of the respective load element.

The frequency divider circuit further comprises a quadrature error detector configured to receive the in-phase and quadrature output signals, detect the quadrature error and provide control signals wherein the frequency divider circuit is configured for delaying the input of data using the control signals.

The frequency divider circuit further comprises a delay unit for delaying input of data, the delay unit being configured to receive as input an input signal being at least one of the first clock signal, second clock signal, first input data signals and the second input data signals and to output a respective delayed signal.

FIG. 1 is a circuit diagram illustrating a transmitter architecture. The transmitter 100 comprises a serializer 101 that is used to perform a 32:4 serialization of data using output clock signals CK8, CK16 and CK32. The transmitter 100 further comprises half-rate clock inputs 103 for clocking a ½ clock divider 104 for producing four output signals 110.1, 110.2, 110.3 and 110.4. The serializer 101 may input a signal pattern at a 4:1 multiplexer 105 input. The multiplexer 105 may select an output signal based on signals 110.1, 110.2, 110.3 and 110.4 of the ½ clock divider 104. The selected output signal is provided to a driver 106. The driver 106 provides two signals, each being processed by a respective combined T-coil and ESD component 107a and 107b before providing outputs OUTP and OUTN.

Figure 2:
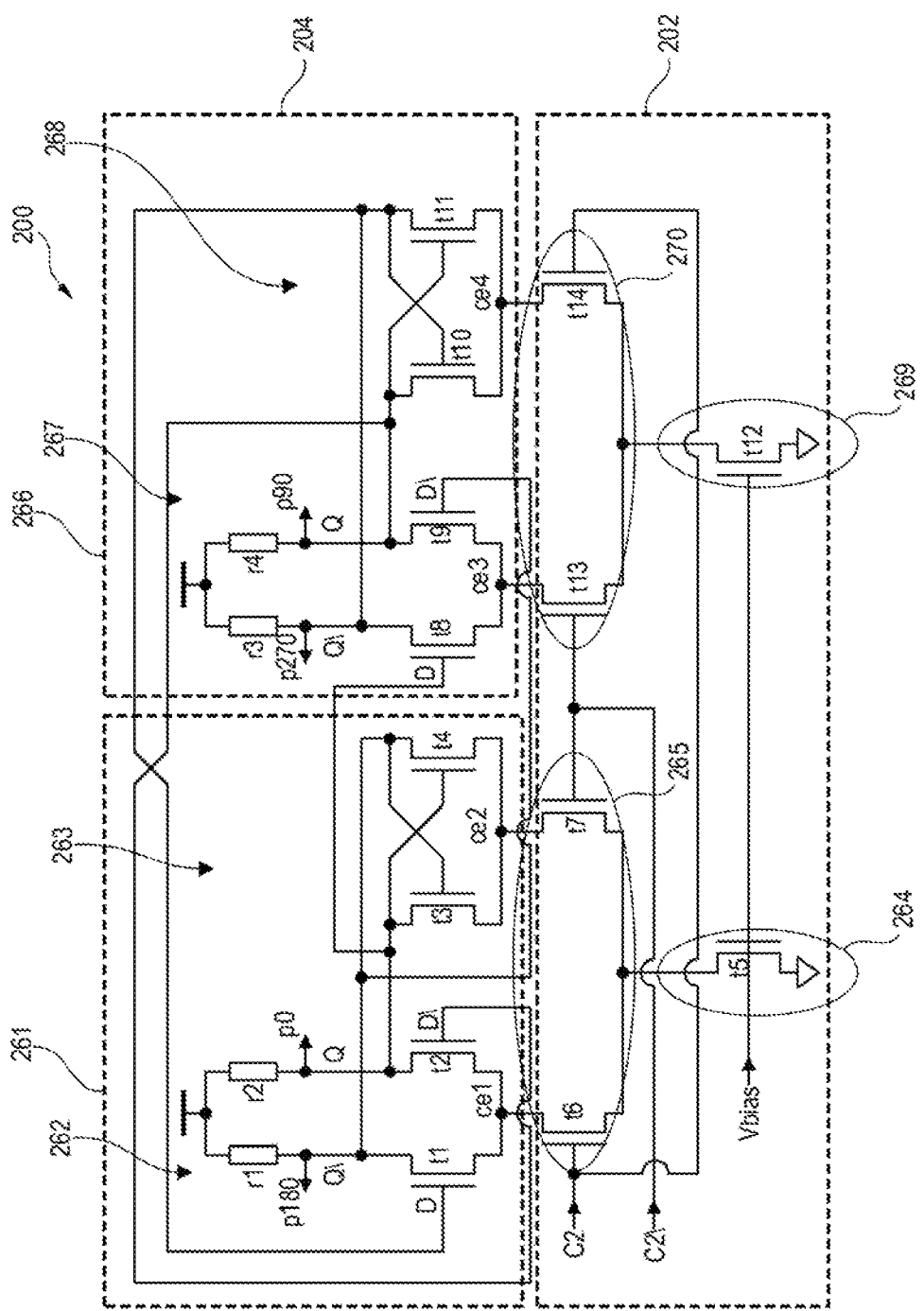
FIG. 2 is a circuit diagram illustrating an exemplary current mode logic (CML) frequency divider circuit.

FIG. 2 is a circuit diagram illustrating an exemplary CML frequency divider circuit.

Frequency divider circuit 200 includes current steering circuitry 202 and latch circuitry 204, which are implemented as CML. Latch circuitry 204 includes a master latch circuitry 261 and a slave latch circuitry 266 connected in series with a feedback path connected between. The connection of the master latch circuitry 261 and the slave latch circuitry 266, in series (differential output to input) with inverted clock signals applied to the differential clock inputs, forms a master-slave D-type flip-flop circuit. A ½ frequency divider is then formed from this master-slave flip-flop configuration by connecting the differential outputs of the slave flip-flop to the differential inputs of the master flip-flop.

In this particular example, the master latch circuitry 261 includes a tracking branch 262 for inputting data and a latching branch 263 for holding data. The tracking branch 262 comprises a differential pair composed of transistors t1 and t2 whose sources are connected in common, whose gates receive data which are signals inverted from each other and whose drains are set as outputs. The drain nodes of the differential pair transistors t1 and t2 are connected to a supply terminal VDD via load resistors r1 and r2. In one example, according to the present subject matter, the load resistors r1 and r2 may be variable load resistors. The tracking branch 262 may, for example, receive input data which are signals inverted from each other via input terminals D and D\. The latching branch 263 comprises cross-coupled transistors t3 and t4 whose sources are connected in common and whose gates and drains are connected across each other to perform a regeneration of the differential pair's output signal. The cross-coupled transistors t3 and t4 have control gates connected to output p0 and output p180 of the tracking branch 262. The outputs of the tracking branch 262 may be labelled in terms of I/Q clock outputs, which include in-phase negative output p180 and in-phase positive output p0. The drain nodes of the transistors t3 and t4 are connected to the drain nodes of the differential pair transistors t1 and t2 of the tracking branch 262, respectively, to receive and hold the outputs from the tracking branch 262.

The slave latch circuitry 266 includes a tracking branch 267 for inputting data and a latching branch 268 for holding data. The tracking branch 267 comprises differential pair transistors t8 and t9 which are connected to the drains of the transistors t3 and t4 of the latching branch 263 in the master latch circuitry 261, respectively, to receive the output data held in the latching branch 263. The collectors of the differential pair transistors t8 and t9 are connected to a supply terminal VDD via load resistors r3 and r4. In one example, according to the present subject matter, the load resistors r3 and r4 may be variable load resistors. The latching branch 268 comprises cross-coupled transistors t10 and t11 which may be set as output terminals. The cross-coupled transistors t10 and t11 have control gates connected to output p90 and output p270 of the tracking branch 267. The outputs of the tracking branch 267 may be labelled in terms of I/Q clock outputs, which include quadrature-phase negative output p270 and quadrature-phase positive output p90.

The current steering circuit 202 comprises a current source circuit 264 for supplying a current to the master tracking branch 262 and master latching branch 263 and a switching circuit 265 for alternately supplying the current to the tracking branch 262 and latching branch 263. The current source circuit 264 comprises a transistor t5 which receives a current value setting signal from a current value setting terminal Vbias at its gate node and whose source is connected to a ground terminal GND. The current steering circuit 202 further comprises a current source circuit 269 for supplying a current to the slave tracking branch 267 and slave latching branch 268 and a switching circuit 270 for alternately supplying the current to the slave tracking branch 267 and slave latching branch 268. The current source circuit 269 comprises a transistor t12 which receives a current value setting signal from a current value setting terminal Vbias at its gate and whose source is connected to a ground terminal GND. The transistor t12 is connected to the current value setting terminal Vbias in common with the gate of transistor t5 of the current source circuit 264. Therefore, the currents having the same value are supplied to the respective differential circuits of the master latch circuit 261 and the slave latch circuit 266.

The switching circuit 265 comprises a pair of switches t6 and t7 whose respective drains are connected to connecting points ce1 and ce2 of the master tracking branch 262 and master latching branch 263 respectively and whose respective sources are connected in common to a drain of the transistor t5 of the current source circuit 264. The switches t6 and t7 turn on alternately and supply the currents to the master tracking branch 262 and master latching branch 263, respectively, by receiving clock signals which are inverted from each other at their gates via respective clock terminals c2 and c2\.

The switching circuit 270 comprises a pair of switches t13 and t14 whose respective drains are connected to connecting points ce3 and ce4 of the slave tracking branch 267 and slave latching branch 268 respectively and whose respective sources are connected in common to a drain of the transistor t12 of the current source circuit 269. The switches t13 and t14 turn on alternately and supply the currents to the slave tracking branch 267 and slave latching branch 268, respectively, by receiving clock signals which are inverted from each other at their gates via respective clock terminals c2\ and c2.

In operation, the master tracking branch 262 writes input data from the input terminals D and D\ when the clock signal of the clock terminal c2 is the high state and at the same time, the slave latching branch 268 holds output data of the slave tracking branch 267. Following to that, in response to the high state of the clock signal of the clock terminal c2\ which is a signal inverted from the clock signal of the clock terminal cell, the master latching branch 263 holds the output data of the master tracking branch 262 and at the same time, the slave tracking branch 267 writes the output data of the master tracking branch 262. For that, the switching circuits 265 and 270 operate as follows. The ON/OFF-timing of the switch t6 may occur simultaneously to that of the switch t14 and the ON/OFF-timing of the switch t7 may be simultaneous with that of the switch t13. When the switches t6 and t14 are ON, the switches t7 and t13 are OFF and vice versa. They are turned ON/OFF simultaneously.

The QEC to adjust the phase difference between 0° and 90° and between 180° and 270° phase pairs, is important to improve the signal integrity and jitter of high-speed transmitters and receivers in which the frequency divider circuit 200 is implemented. The present subject matter may eliminate the drawbacks of a conventional QEC by directly incorporating the phase correction into the divider 200 via splitting up its load control into a master and slave section, which allows an individual turnability, resulting in the desired phase correction as described with the following Figures.

Figure 3A:
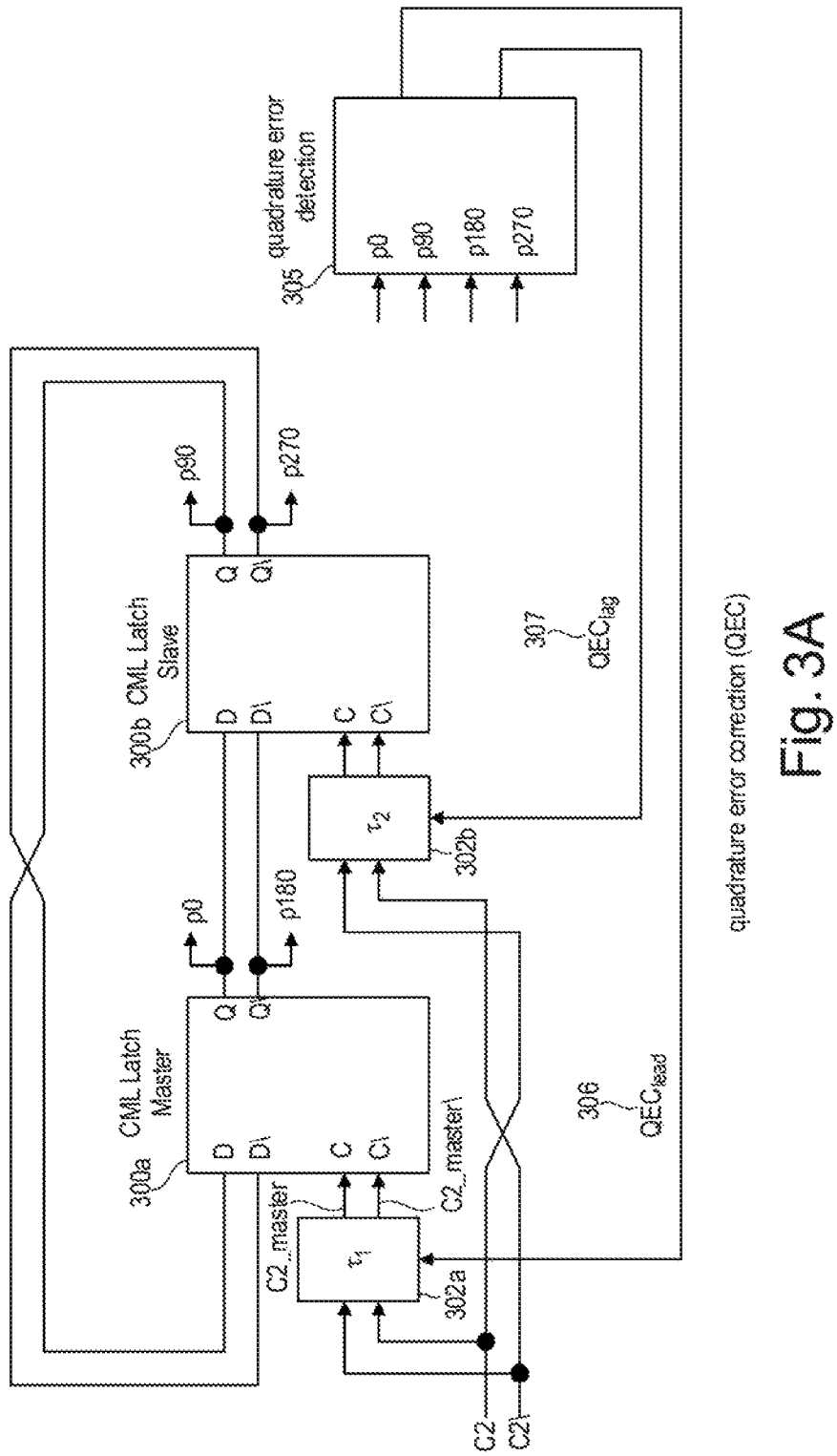
FIG. 3A is a circuit diagram of a frequency divider circuit according to an example of the present subject matter.

FIG. 3A is a circuit diagram of a frequency divider circuit according to an example of the present subject matter. As shown in FIG. 3A, the frequency divider circuit comprises a master latch circuitry 300a and a slave latch circuitry 300b and delay circuits 302a and 302b.

The master latch circuitry 300a and the slave latch circuitry 300b, which are identically constructed, switch between a data latching operation and a data-through operation with respect to differential data signals that are input to data input terminals D, D\, in response to differential clock signals that are input to clock input terminals C, C\, and output the signals to output terminals Q, Q\.

The master latch circuitry 300a and the slave latch circuitry 300b perform the data latching operation when the high level (active level) of the clock signal is impressed upon one clock input terminal C, and perform the data-through operation when the high level (active level) of the clock signal is impressed upon the other clock input terminal C\.

A clock signal C2_master is supplied to the clock input terminal C of the master latch circuit and a clock signal C2_master\ is supplied to the clock input terminal C\ of the master latch circuit. The clock signal C2_master may be obtained by delaying using the delay circuit 302a the first clock signal C2. The clock signal C2_master\ may be obtained by delaying using the delay circuit 302a the second clock signal C2\. A clock signal C2_slave is supplied to the clock input terminal C of the slave latch circuit and a clock signal C2_slave\ is supplied to the clock input terminal C\ of the slave latch circuit. The clock signal C2_slave may be obtained by delaying using the delay circuit 302b of the first clock signal C2. The clock signal C2_slave\ may be obtained by delaying using the delay circuit 302b of the second clock signal C2\. An exemplary implementation of the delay circuits 302a-b is described with reference to FIG. 4A.

Figure 3B:
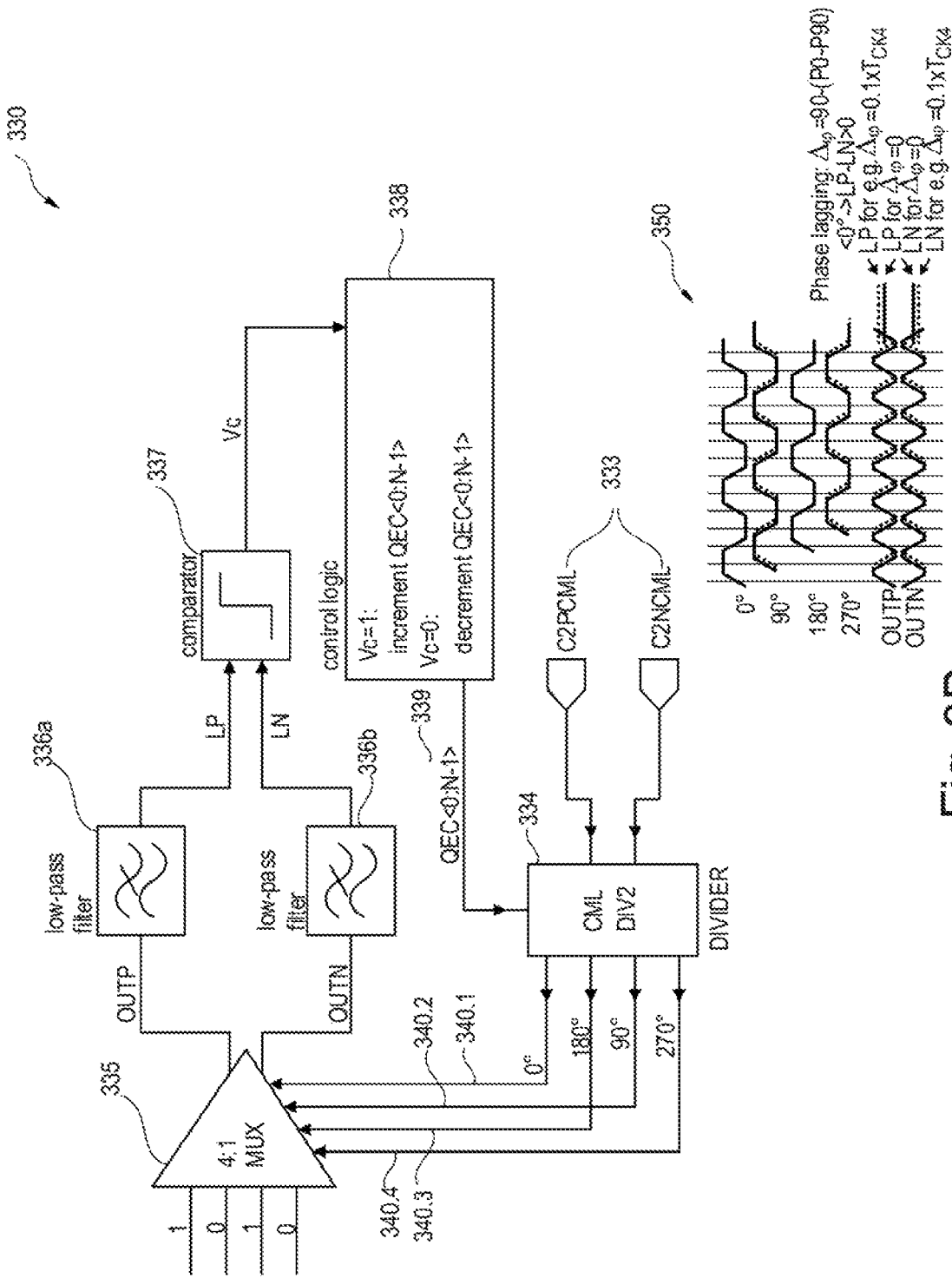
FIG. 3B depicts a quadrature error correction control circuit diagram for enabling quadrature error corrections in accordance with the present subject matter.

The circuit of FIG. 3A may introduce variable delays either at the input terminals of the master and slave latch circuits. The delay may be performed in order to correct quadrature errors. For that, a quadrature error detector 305 may be used. The quadrature error detector 305 is configured to detect quadrature errors by comparing the two pairs of output signals (p0, p90) and (p180, p270). Based on the comparison results of the pairs (p0, p90) and (p180, p270) respective control signals 306 and 307 may be generated by the quadrature error detector 305. The control signals 306 and 307 may be indicative of a delay value to be applied by the delay circuits 302a and 302b respectively. The control signal 306 may, for example, introduce a delay that affects the output signal p0 so that the quadrature error between p0 and 90 may be corrected. The control signal 307 may for example introduce a delay that affects the output signal p270 so that the quadrature error between p180 and p270 may be corrected. The control signals 306-307 may be n-bit wide, where n is a predefined number e.g. n=4, 5, etc. The values of the n-bits may be predefined values (e.g. as described with reference to FIG. 7). For example, each value of the pair (p0, p90) may be associated with a corresponding delay value, wherein the delay value may be indicated by specific values of the n-bits of the control signal 306. Each value of the pair (p180, p270) may be associated with a corresponding delay value, wherein the delay value may be indicated by specific values of the n-bits of the control signal 307. FIG. 3B shows an example circuit for proving the control signals 306 and 307.

FIG. 3B depicts a quadrature error correction control circuit diagram for enabling quadrature error corrections in accordance with the present subject matter. The QEC control circuit 330 comprises half-rate clock inputs 333 for clocking a ½ clock divider 334 for producing four output signals 340.1, 340.2, 340.3 and 340.4. A static 1010 or 0101 pattern may be applied at a 4:1 multiplexer 335 input. The multiplexer 335 may select an output signal OUPTP and OUTN based on signals 340.1, 340.2, 340.3 and 340.4 of the ½ clock divider 104. The selected output signals are filtered by a respective low pass filter 336a and 336b. The resulting filtered output signals LP of the output signal OUTP and LN of the output signal OUTN are fed to a differential comparator 337. The differential comparator 337 may provide a comparison result Vc of the filtered output signals LP and LN to a control logic 338. The control logic 338 may generate a control signal 339 to control input of data in the divider 334 according to the present subject matter. For example, the control logic 338 may be implemented as bang-bang control (e.g., increment/decrement until input signal flips) that increases or decreases a control vector QEC<0:N−1> of the divider 334.

FIG. 3B further shows a graph 350 illustrating the phase shift or difference between the pair of signals 340.1 and 340.3 and between the pair of signals 340.2 and 340.4. The phase shift between signals 340.1-4 indicates a quadrature error. Thus, by comparing the signals 340.1 to 340.4 a quadrature error may be detected. This quadrature error converts into larger pulses at every odd bit in the multiplexer output pattern. That is, the pertinent lowpass filtered output LP is higher than its value for Δφ=90−(P0−P90)=90 degrees. The pulses become larger because the phase shift shown in FIG. 3B by the dashed waveforms is a phase lagging. However, in case of a phase leading, said pulses may be smaller and the pertinent filtered output LP may be lower than its value for Δφ. Since the filtered output LN behaves complementary to the output LP, the output Vc of the differential comparator 337 indicates either a logical 1 for phase lagging or a logical 0 for phase leading.

In this implementation, the QEC control may not reach steady state because of the bang-bang control but it gets closest to its optimum value. A quasi-static control can be obtained with averaging of the bang-bang states.

Figure 4A:
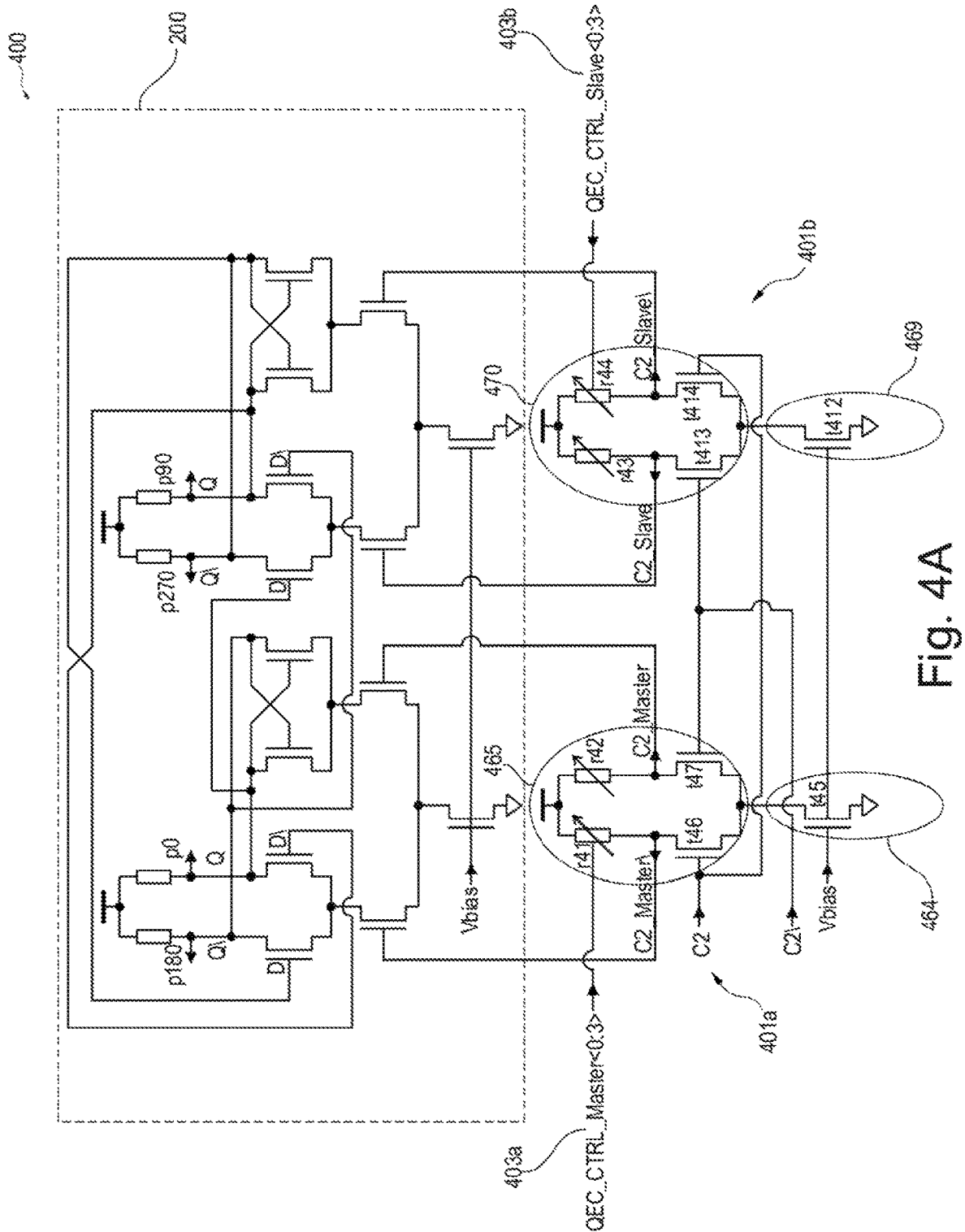
FIG. 4A is a circuit diagram illustrating an exemplary CML frequency divider circuit in accordance with the present subject matter.

FIG. 4A is a circuit diagram illustrating an exemplary CML frequency divider circuit 400. The frequency divider circuit 400 comprises all component of the frequency divider circuit 200 of FIG. 2 and delay circuits 401a and 401b.

The delay circuit 401a comprises a current source circuit 464 and a switching circuit 465. The current source circuit 264 comprises a transistor t45 which receives a current value setting signal from a current value setting terminal Vbias at its gate and whose source is connected to a ground terminal GND. The switching circuit 465 comprises a differential pair t46 and t47 whose respective sources are connected in common to a drain of the transistor t45 of the current source circuit 464. The drains of the differential pair t46 and t47 are connected to a supply terminal VDD via variable load resistors r41 and r42. The differential pair t46 and t47 turn on alternately with respect to the differential pair t413 and t414 by receiving clock signals C2 and C2\ which are inverted from each other at their gate nodes and produce respectively delayed clock signals C2_Master and C2_Master\.

The delay circuit 401b comprises a current source circuit 469 and a switching circuit 470. The current source circuit 469 comprises a transistor t412 which receives a current value setting signal from a current value setting terminal Vbias at its gate and whose source is connected to a ground terminal GND. The transistor t412 is connected to the current value setting terminal Vbias in common with the gate of the transistor t45 of the current source circuit 464. The switching circuit 470 comprises a pair of switches t413 and t414 whose respective sources are connected in common to a drain of the transistor t412 of the current source circuit 469. The drain nodes of the switches t413 and t414 are connected to a source terminal VDD via variable load resistors r43 and r44.

The differential pair t413 and t414 turn on alternately with respect to the differential pair t46 and t47 by receiving clock signals C2\ and C2 which are inverted from each other at their gates and produce respectively delayed clock signals C2_Slave\ and C2_Slave.

The resistance of each of the variable load resistors r41, r42, r43 and r43 may be adjusted using control signals. For example, the resistance of the load resistor r41 or r42 may be adjusted using a control signal 403a. The resistance of the load resistor r43 or r44 may be adjusted using a control signal 403b. The control signals 403a, 403b may for example be generated by a quadrature error detector e.g. as described with reference to FIG. 3A. By adapting the resistance of a load resistor, a resulting time constant (defined as load resistance times load capacitance, provided by parasitic and intrinsic capacitances) may be adjusted. This may cause a delay of the input data which may enable a quadrature error correction.

Figure 4B:
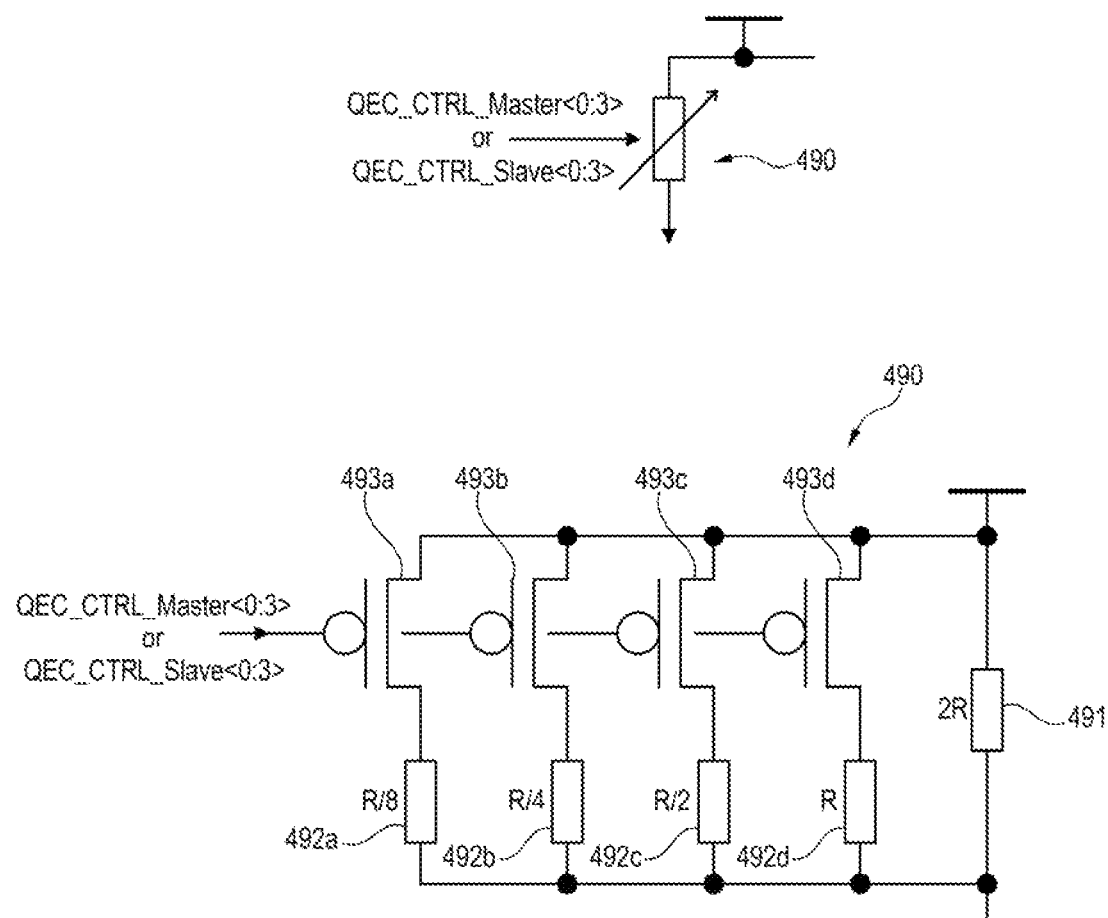
FIG. 4B is a circuit diagram illustrating an exemplary load resistor in accordance with the present subject matter.

FIG. 4B is a circuit diagram illustrating an exemplary load resistor 490 such as load resistor r41, r42, r43 or r44, in accordance with the present subject matter. The load resistor 490 comprises multiple resistors that can be connected to each other in accordance with different combinations. For simplification of the description, FIG. 4B shows five resistors but it is not limited to that number. The load resistor 490 comprises by default a single resistor 491. The load resistor 490 optionally can include additional one or more resistors 492*a*, 492*b*, 492*c* and 492*d*. Each of the resistors 492*a* to 492*d* is serially connected to a respective switch 493*a* to 493*d*. The switches may be controlled by the control signal 403*a* or 403*b*. The control signals 403*a-b* are four bits wide associating each bit to the respective resistor of the resistors 492*a* to 492*d*. By changing the values of the four bits different combinations of resistors can be built and thus resulting in different resistances of the load resistor 490.

Figure 5:
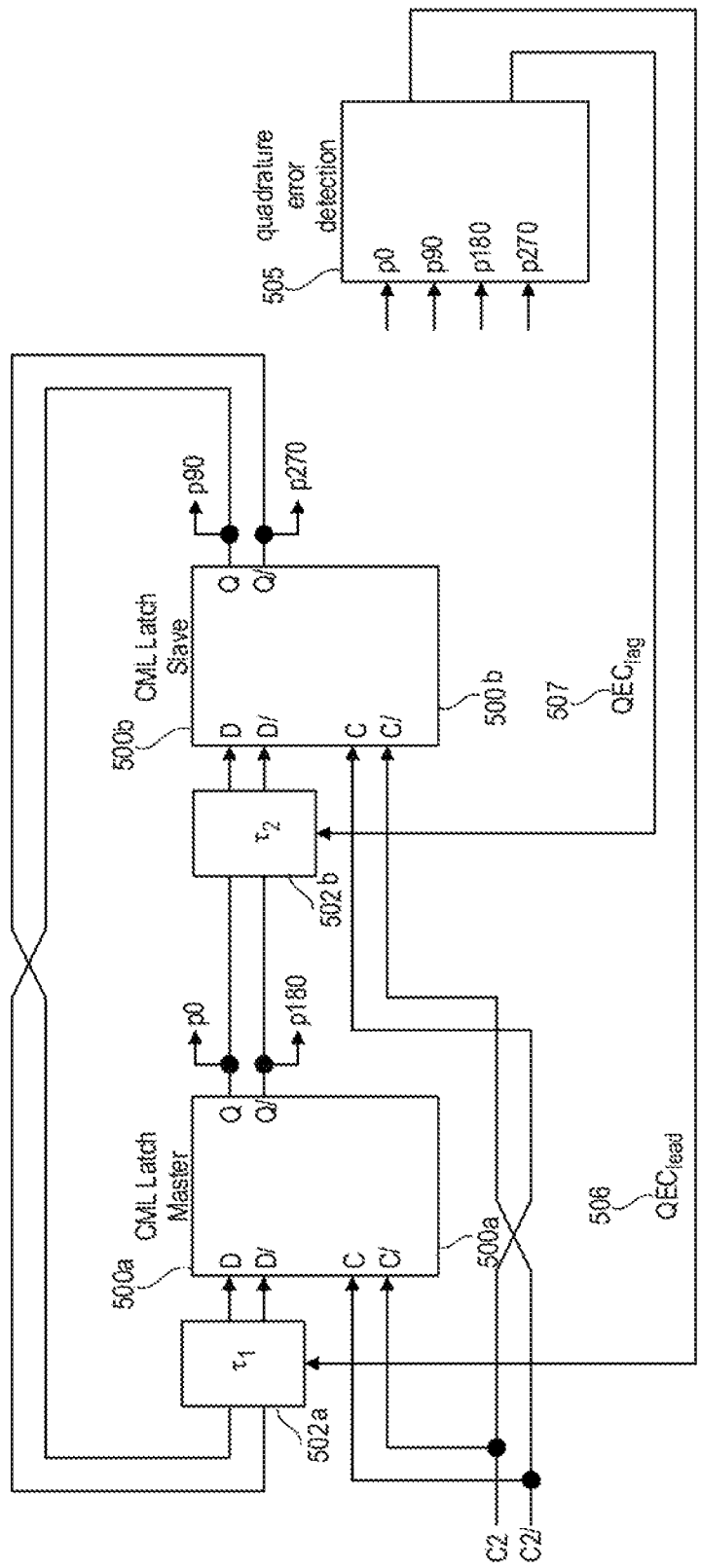
FIG. 5 is a circuit diagram of a frequency divider circuit according to an example of the present subject matter.

FIG. 5 is a circuit diagram of a frequency divider circuit according to an example of the present subject matter. As shown in FIG. 5, the frequency divider circuit comprises a master latch circuitry 500*a* and a slave latch circuitry 500*b* and delay circuits 502*a* and 502*b*.

The master latch circuitry 500*a* and the slave latch circuitry 500*b*, which are identically constructed, switch between a data latching operation and a data-through operation with respect to differential data signals that are input to data input terminals D, D\, in response to differential clock signals that are input to clock input terminals C, C\, and output the signals to output terminals Q, Q\.

The master latch circuitry 500*a* and the slave latch circuitry 500*b* perform the data latching operation when the high level (active level) of the clock signal is impressed upon one clock input terminal C, and perform the data-through operation when the high level (active level) of the clock signal is impressed upon the other clock input terminal C\.

A clock signal C2 is supplied to the clock input terminal C\ of the master latch circuit and a clock signal C2\ is supplied to the clock input terminal C of the master latch circuit. The clock signal C2 is supplied to the clock input terminal C of the slave latch circuit and the clock signal C2\ is supplied to the clock input terminal C\ of the slave latch circuit.

An exemplary implementation for obtaining the delay circuits 502*a-b* is described with reference to FIG. 6.

The circuit of FIG. 5 may introduce variable delays either at the input of data of the master and slave latch circuits. The delay may be performed in order to correct quadrature errors. For that, a quadrature error detector 505 may be used. The quadrature error detector 305 is configured to detect quadrature errors by comparing the two pairs of output signals (p0, p90) and (p180, p270). Based on the comparison results of the pairs (p0, p90) and (p180, p270) respective control signals 506 and 507 may be generated by the quadrature error detector 505. The control signals 506 and 507 may be indicative of a delay value to be applied by the delay circuits 502*a* and 502*b* respectively. The control signal 506 may for example introduce a delay that affects the output signal p0 so that the quadrature error between p0 and 90 may be corrected. The control signal 507 may for example introduce a delay that affects the output signal p270 so that the quadrature error between p180 and p270 may be corrected. The control signals 506-507 may be n-bit wide, where n is a predefined number e.g. n=4, 5, etc. The values of the n-bits may be predefined values. For example, each value of the pair (p0, p90) may be associated with a corresponding delay value, wherein the delay value may be indicated by specific values of the n-bits of the control signal 506. Each value of the pair (p180, p270) may be associated with a corresponding delay value, wherein the delay value may be indicated by specific values of the n-bits of the control signal 507.

Figure 6:
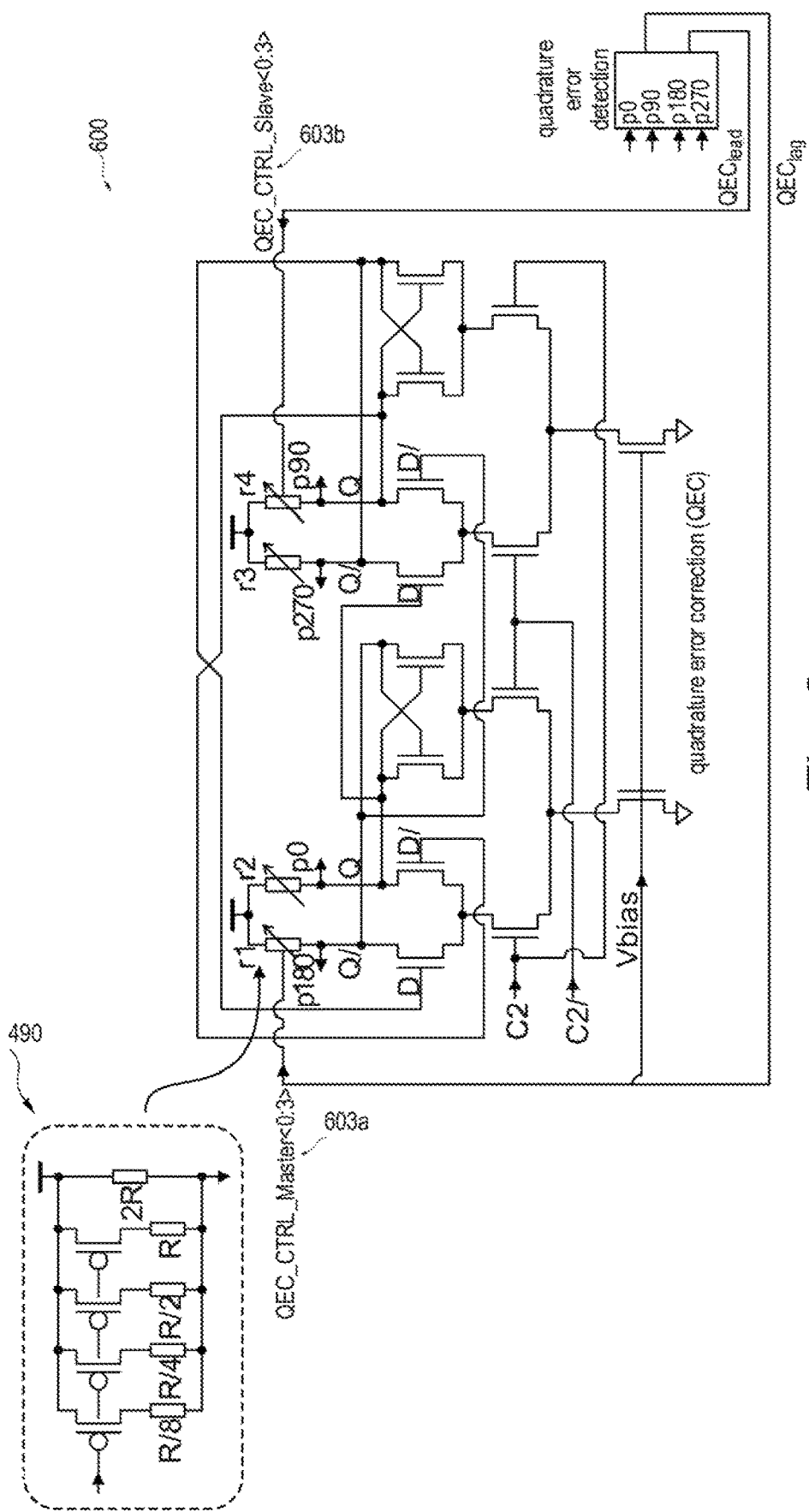
FIG. 6 is a circuit diagram illustrating an exemplary CML frequency divider circuit in accordance with the present subject matter.

FIG. 6 is a circuit diagram illustrating an exemplary CML frequency divider circuit 600. The frequency divider 600 is similar to the frequency divider 200 with the difference that the load resistors r1, r2, r3 and r4 are variable load resistors in the circuit of FIG. 6. As indicated in FIG. 6, each of the load resistors r1, r2, r3 and r4 may have the structure of the load resistor 490 of FIG. 4B.

The frequency divider circuit 600 is configured to receive control signals 603*a* and 603*b* from a quadrature error detector 605. The quadrature error detector 605 is configured to generate the control signals 603*a* and 603*b* as described with reference to the quadrature error detector 305 of FIG. 3A.

The resistance of each of the variable load resistors r1, r2, r3 and r4 may be adjusted using the control signals 603*a* and 603*b*. For example, the resistance of the load resistor r1 or r2 may be adjusted using a control signal 603*a*. The resistance of the load resistor r3 or r4 may be adjusted using the control signal 603*b*. By adapting the resistance of a load resistor, a resulting time constant may be adjusted. This may cause a delay of the input data.

Figure 7:
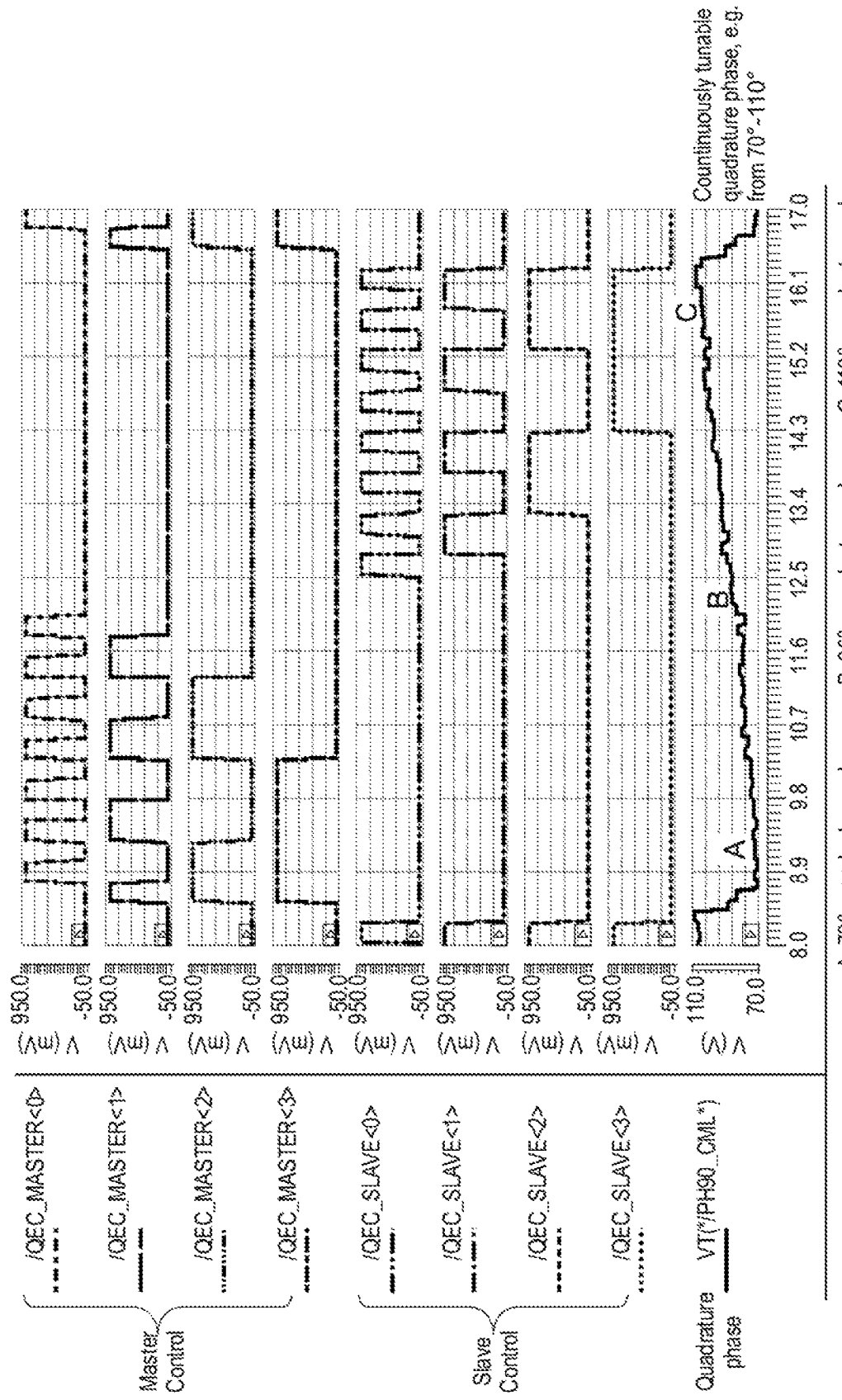
FIG. 7 depict graphs of values of control vectors and the resulting quadrature phase in accordance with the present subject matter.

FIG. 7 depict graphs of values of control vectors e.g. 506 and 507 and the resulting quadrature phase in accordance with the present subject matter. FIG. 7 indicates that each quadrature phase value between 70° and 110° may be associated with a pair of control vectors for the master and slave branches respectively. FIG. 7 shows values of each bit of four bits of a control vector for master control and for slave control.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Based on the foregoing, a computer system, method, and computer program product have been disclosed. However, numerous modifications and substitutions can be made without deviating from the scope of the present invention. Therefore, the present invention has been disclosed by way of example and not limitation.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A frequency divider circuit comprising:
    a master and slave latch connected in series and having a feedback path, the master latch including a master reading branch with first input terminals and a master latching branch with quadrature output signals, the slave latch including a slave reading branch with second input terminals and a slave latching branch with in-phase output signals;
    a first current supplying circuit for supplying a first current to the master reading branch and the master latching branch;
    a second current supplying circuit for supplying a second current to the slave latching branch and the slave reading branch; and a current steering circuit for connecting the first current supplying circuit to the master reading branch and connecting the second current supplying circuit to the slave latching branch in response to a first clock signal; and connecting the second current supplying circuit to the slave reading branch and connecting the first current supplying circuit to the master latching branch in response to a second clock signal;

wherein the frequency divider circuit is configured for delaying input of data to the first and/or second input terminals for correcting a quadrature error between the quadrature and in-phase output signals.

2. The frequency divider circuit of claim 1, the frequency divider circuit being configured for delaying the input of data by delaying first input data signals of the first input terminals and/or second input data signals of the second input terminals.

3. The frequency divider circuit of claim 2, each of the quadrature output signals being connected via a tuneable load element to a supply potential and each of the in-phase output signals being connected via a load element to a supply potential, each load element of the load elements comprising resistors, the frequency divider circuit being configured for delaying the first input data signal and/or the second input data signal by adjusting a resistance of the respective load elements.

4. The frequency divider circuit of claim 3, the frequency divider circuit being configured for adjusting the resistance of the load element by connecting a combination of resistors of the load element.

5. The frequency divider circuit of claim 4, the frequency divider circuit being configured for connecting the combination of resistors using a n-bits delay-setting input level, where n is an initial number of resistors in the load element.

6. The frequency divider circuit of claim 5, further comprising a quadrature error detector configured to receive the in-phase and quadrature output signals, detect the quadrature error and provide control signals comprising the n-bits delay-setting input level.

7. The frequency divider circuit of claim 1, the frequency divider circuit being configured for delaying the input of data by delaying the first clock signal and/or the second clock signal.

8. The frequency divider circuit of claim 7, each of the first and second clock signals being connected via a tuneable load element to a supply potential, each load element of the load elements comprising resistors, the frequency divider circuit being configured for delaying the first clock signal and/or the second clock signal by adjusting a resistance of the respective load element.

9. The frequency divider circuit of claim 1, further comprising a quadrature error detector configured to receive the in-phase and quadrature output signals, detect the quadrature error and provide control signals wherein the frequency divider circuit is configured for delaying the input of data using the control signals.

10. A transmitter comprising the frequency divider circuit of claim 1 and a quadrature error detector, the quadrature error detector configured to receive in-phase and quadrature output signals of the divider circuit, detect a quadrature error and provide control signals wherein the frequency divider circuit is configured for delaying the input of data using the control signals.

11. A method for quadrature error correction using a frequency divider circuit, the frequency divider circuit comprising a master and slave latch connected in series and having a feedback path, the master latch including a master reading branch with first input terminals and a master latching branch with quadrature output signals, the slave latch including a slave reading branch with second input terminals and a slave latching branch with in-phase output signals; a first current supplying circuit for supplying a first current to the master reading branch and the master latching branch; a second current supplying circuit for supplying a second current to the slave latching branch and the slave reading branch; a current steering circuit for connecting the first current supplying circuit to the master reading branch and connecting the second current supplying circuit to the slave latching branch in response to a first clock signal; and connecting the second current supplying circuit to the slave reading branch and connecting the first current supplying circuit to the master latching branch in response to a second clock signal; the method comprising: delaying input of data to the first and/or second input terminals for correcting a quadrature error between the quadrature and in-phase output signals.

* * * * *